(12) United States Patent
Chilcott

(10) Patent No.: US 7,214,324 B2
(45) Date of Patent: May 8, 2007

(54) TECHNIQUE FOR MANUFACTURING MICRO-ELECTRO MECHANICAL STRUCTURES

(75) Inventor: Dan W. Chilcott, Greentown, IN (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 11/107,083

(22) Filed: Apr. 15, 2005

(65) Prior Publication Data
US 2006/0231521 A1    Oct. 19, 2006

(51) Int. Cl.
*C23F 1/00* (2006.01)

(52) U.S. Cl. .............................. 216/2; 216/36; 216/57; 438/53; 438/456; 438/459; 257/419

(58) Field of Classification Search ..................... None
See application file for complete search history.

(56) References Cited

U.S. PATENT DOCUMENTS

| | | | | |
|---|---|---|---|---|
| 4,506,283 A * | 3/1985 | Soclof | ........................ | 257/536 |
| 4,784,721 A * | 11/1988 | Holmen et al. | ................. | 216/2 |
| 4,821,997 A * | 4/1989 | Zdeblick | ..................... | 251/11 |
| 4,961,821 A * | 10/1990 | Drake et al. | .................... | 438/21 |
| 5,041,190 A * | 8/1991 | Drake et al. | .................... | 438/21 |
| 5,178,016 A * | 1/1993 | Dauenhauer et al. | ......... | 73/727 |
| 5,223,086 A * | 6/1993 | Terada et al. | ................. | 438/51 |
| 5,289,721 A * | 3/1994 | Tanizawa et al. | ............. | 73/727 |
| 5,326,426 A * | 7/1994 | Tam et al. | ..................... | 216/12 |
| 5,333,831 A * | 8/1994 | Barth et al. | .................... | 251/11 |
| 5,476,819 A * | 12/1995 | Warren | ........................ | 438/456 |
| 5,520,054 A * | 5/1996 | Romo | ........................... | 73/715 |
| 5,529,279 A * | 6/1996 | Beatty et al. | .................. | 251/11 |
| 5,656,781 A * | 8/1997 | Kankkunen | ................... | 73/724 |
| 5,681,775 A * | 10/1997 | Pogge | ........................ | 438/406 |
| 5,761,957 A * | 6/1998 | Oba et al. | ...................... | 73/727 |
| 5,867,192 A * | 2/1999 | Mantell et al. | ................ | 347/65 |
| 5,905,201 A * | 5/1999 | Petri | ........................ | 73/504.03 |
| 5,935,739 A * | 8/1999 | Bayer et al. | .................... | 430/5 |
| 5,949,118 A * | 9/1999 | Sakai et al. | ................... | 257/419 |
| 5,985,693 A * | 11/1999 | Leedy | ........................ | 438/107 |
| 6,038,928 A * | 3/2000 | Maluf et al. | ................... | 73/724 |
| 6,107,209 A * | 8/2000 | Ohkuma | ....................... | 438/733 |
| 6,139,761 A * | 10/2000 | Ohkuma | ....................... | 216/27 |
| 6,143,190 A * | 11/2000 | Yagi et al. | ..................... | 216/27 |
| 6,263,740 B1 * | 7/2001 | Sridhar et al. | ................. | 73/754 |
| 6,450,621 B1 * | 9/2002 | Hayakawa | ..................... | 347/63 |
| 6,497,474 B2 * | 12/2002 | Irinoda et al. | ................. | 347/54 |
| 6,523,762 B1 * | 2/2003 | Luginbuhl et al. | ........... | 239/589 |
| 6,541,834 B1 * | 4/2003 | Shie et al. | .................... | 257/419 |
| 6,555,480 B2 * | 4/2003 | Milligan et al. | ............ | 438/719 |

(Continued)

*Primary Examiner*—Allan Olsen
(74) *Attorney, Agent, or Firm*—Jimmy L. Funke

(57) ABSTRACT

A technique for manufacturing a micro-electro mechanical structure includes a number of steps. Initially, a cavity is formed into a first side of a handling wafer, with a sidewall of the cavity forming a first angle greater than about 54.7 degrees with respect to a first side of the handling wafer at an opening of the cavity. Then, a bulk etch is performed on the first side of the handling wafer to modify the sidewall of the cavity to a second angle greater than about 90 degrees, with respect to the first side of the handling wafer at the opening of the cavity. Next, a second side of a second wafer is bonded to the first side of the handling wafer.

19 Claims, 5 Drawing Sheets

U.S. PATENT DOCUMENTS

| | | | |
|---|---|---|---|
| 6,612,535 B1 * | 9/2003 | Tai et al. | 251/11 |
| 6,629,465 B1 * | 10/2003 | Maluf et al. | 73/724 |
| 6,648,454 B1 * | 11/2003 | Donaldson et al. | 347/65 |
| 6,661,637 B2 * | 12/2003 | McIntosh et al. | 361/233 |
| 6,686,642 B2 * | 2/2004 | Regan et al. | 257/521 |
| 6,776,916 B2 * | 8/2004 | Hess | 216/27 |
| 6,805,432 B1 * | 10/2004 | Milligan et al. | 347/65 |
| 6,818,138 B2 * | 11/2004 | Obert et al. | 216/27 |
| 6,869,818 B2 * | 3/2005 | Harris et al. | 438/50 |
| 6,875,365 B2 * | 4/2005 | Watanabe et al. | 216/2 |
| 6,887,393 B2 * | 5/2005 | Conta et al. | 216/2 |
| 6,942,750 B2 * | 9/2005 | Chou et al. | 156/272.2 |
| 2002/0118253 A1 * | 8/2002 | Ohno et al. | 347/47 |
| 2002/0164113 A1 * | 11/2002 | Rensing et al. | 385/18 |
| 2002/0179563 A1 * | 12/2002 | Horning et al. | 216/2 |
| 2002/0182895 A1 * | 12/2002 | Butschke et al. | 438/942 |
| 2004/0125174 A1 * | 7/2004 | Anderson et al. | 347/64 |
| 2004/0233240 A1 * | 11/2004 | Patil | 346/140.1 |

* cited by examiner

TECHNIQUE FOR MANUFACTURING MICRO-ELECTRO MECHANICAL STRUCTURES

TECHNICAL FIELD

The present invention is generally directed to a micro-electro mechanical structure and, more specifically, to a technique for manufacturing micro-electro mechanical structures.

BACKGROUND OF THE INVENTION

A variety of techniques have been utilized to manufacture micro-electro mechanical (MEM) structures, which are now utilized in a variety of applications to perform a number of functions. For example, MEM structures have been utilized in pressure sensors that are currently employed in many automotive and consumer products. A common technique for manufacturing silicon pressure sensors has involved forming sense elements on top of a silicon wafer and wet etching through a back side of the wafer (to an etch stop layer) to create a thin silicon membrane, under the sense elements. The sense elements, e.g., piezoresistive or capacitive elements, are implemented to sense a deflection of the membrane. In a typical process, the wet etch leaves a 125.3 degree angled sidewall at the edge of the membrane.

The wafer is then bonded to a second substrate, e.g., a glass plate, to isolate the membrane from stresses, e.g., packaging stresses. The second substrate is either solid (for absolute pressure sensing) or has been pre-drilled with a hole placed under the membrane (for differential pressure sensing). While this technique has proven relatively successful, the area of the sensor has been larger than electrically necessary, due to the constraints imposed by the wet etch, which follows the crystalline planes of the silicon and typically provides a membrane having a diameter of about 500–1500 microns. While an anisotropic dry backside etch could be utilized to etch all of the crystalline planes equally and, thereby, reduce sensor area, there are currently no reliable etch stops that adequately maintain membrane thickness for current dry etch processes.

Another technique has first formed a cavity in a top side of a first wafer, i.e., used a cavity-on-top process, to form a pressure sensor to get around size limitations of the backside cavity process for forming pressure sensors. In this process, a second wafer is then bonded to the first wafer. After bonding the wafers, the second wafer is thinned to form a membrane over the cavity in the first wafer. While this process reduces the size of the membrane, an angle at the membrane interface is only approximately 54.7 degrees. As such, sensors made with this process have a less robust membrane, as the membrane is not as well supported as a sensor made with the backside cavity process. Furthermore, while the cavity-on-top version of the sensor has been successfully used to create absolute pressure sensors, the lack of an etch stop on the underside of the membrane makes it difficult to create differential pressure sensors using the cavity-on-top process.

Yet another technique for manufacturing sensors has used surface micromachining of semiconductor thin films and undercutting of a sacrificial layer to free the membrane of the sensor. Unfortunately, stress control of thin film membranes is generally inferior to stress control of single-crystal silicon membranes.

What is needed is a technique for manufacturing micro-electro mechanical structures that provide a relatively small, reliable and economical sensor.

SUMMARY OF THE INVENTION

The present invention is directed to a technique for manufacturing micro-electro mechanical (MEM) structures. Initially, a cavity is formed into a first side of a first wafer that functions as a handling wafer. A sidewall of the cavity forms a first angle greater than about 54.7 degrees, with respect to the first side of the handling wafer at an opening of the cavity. Next, a bulk etch is performed on the first side of the handling wafer to modify the sidewall of the cavity to a second angle greater than about 90 degrees, with respect to the first side of the handling wafer at the opening of the cavity. Then, a second side of a second wafer is bonded to the first side of the handling wafer.

According to another aspect of the present invention, the second wafer is an epitaxial wafer that includes a buried etch stop layer positioned at a desired depth from the first side of the epitaxial wafer. According to another embodiment of this aspect of the present invention, the method further comprises the steps of: removing a portion of the epitaxial wafer from the first side of the epitaxial wafer until the etch stop layer is exposed and removing the etch stop layer from the epitaxial wafer to provide the membrane. Typically, a thickness of the membrane may be between about 10 microns and 25 microns.

According to another aspect of the present invention, the first and second wafers are N-type silicon wafers having (100) Miller Indices.

According to another embodiment of the present invention, the first and second wafers are silicon wafers. According to a different aspect of the present invention, the epitaxial wafer is an N-type wafer and the buried etch stop layer is a P-type++ etch stop layer.

According to yet another aspect of the present invention, a hole is formed through the handling wafer from a second side of the handling wafer to the first side of the handling wafer approximate the cavity to provide a differential pressure sensor. According to this embodiment, the hole may be formed using a deep reactive ion etch (DRIE). According to a different aspect of the present invention, the first angle is about 90 degrees and the second angle is about 125.3 degrees.

These and other features, advantages and objects of the present invention will be further understood and appreciated by those skilled in the art by reference to the following specification, claims and appended drawings.

BRIEF DESCRIPTION OF THE DRAWINGS

The present invention will now be described, by way of example, with reference to the accompanying drawings, in which.

DESCRIPTION OF THE PREFERRED EMBODIMENTS

According to the present invention, a lower cost microelectro mechanical (MEM) pressure sensor, e.g., a single-crystal silicon pressure sensor, is produced that has a reduced size, while providing a rugged membrane. As is discussed above, the area required for a sensor die has typically been determined by the processes that are used to micromachine a membrane (diaphragm) of the sensor. According to the present invention, a membrane is formed by a thin silicon layer that is left after thinning of an active wafer. Furthermore, if desired, access to the back of the membrane can readily be provided by a partial etch of the handling wafer, before bonding, followed by a deep reactive ion etch (DRIE) from the back of the handling wafer. In this manner, the area occupied by the etched hole is reduced, while the membrane size is readily controlled.

As is mentioned above, a pressure sensor manufactured using a backside etch process has provided a relatively large size sensor with a sidewall to membrane angle of about 125.3 degrees. As is also mentioned above, sensors made using a cavity-on-top process, i.e., bulk etching of a handling wafer at the bond interface, have had a relatively small size. Unfortunately, the cavity-on-top process creates an angle of about 54.7 degrees at the sidewall-membrane interface, which provides a sensor having a less durable membrane than provided using the backside etch process. According to one embodiment of the present invention, performing a 90-degree DRIE prior to a bulk etch provides a sensor having an angle of 125.3 degrees at the sidewall-membrane interface, while reducing an area required by the sensor die.

According to the present invention, a number of processing steps are disclosed that advantageously provide a bond/etch back pressure sensor that is robust, due to the sidewall angle at the sidewall-membrane interface. Furthermore, the process may include an etch stop (e.g., an oxide layer) under the membrane, i.e., between the membrane and a handling wafer, which advantageously allows a differential version of the sensor to be readily manufactured.

As the handling wafer is not oxidized, it is exposed to a silicon etch back solution during the etch back step. Thus, it is desirable for the handling wafer be composed of a material that is resistant to the etch back solution utilized. For example, when the epitaxial wafer is an N-type epitaxial wafer, the handling wafer may be made from a heavy boron doped P-type++ or a (111) Miller Indices oriented silicon. It should be appreciated that P-type++ doped silicon and/or (111) Miller Indices oriented silicon has extremely slow etch rates for the etchants used for N-type silicon. It should also be appreciated that the invention is not limited to pressure sensor membrane fabrication and is broadly applicable to any number of MEM devices that implement silicon structures, e.g., accelerometers, gyroscopes, etc.

Figure 1:
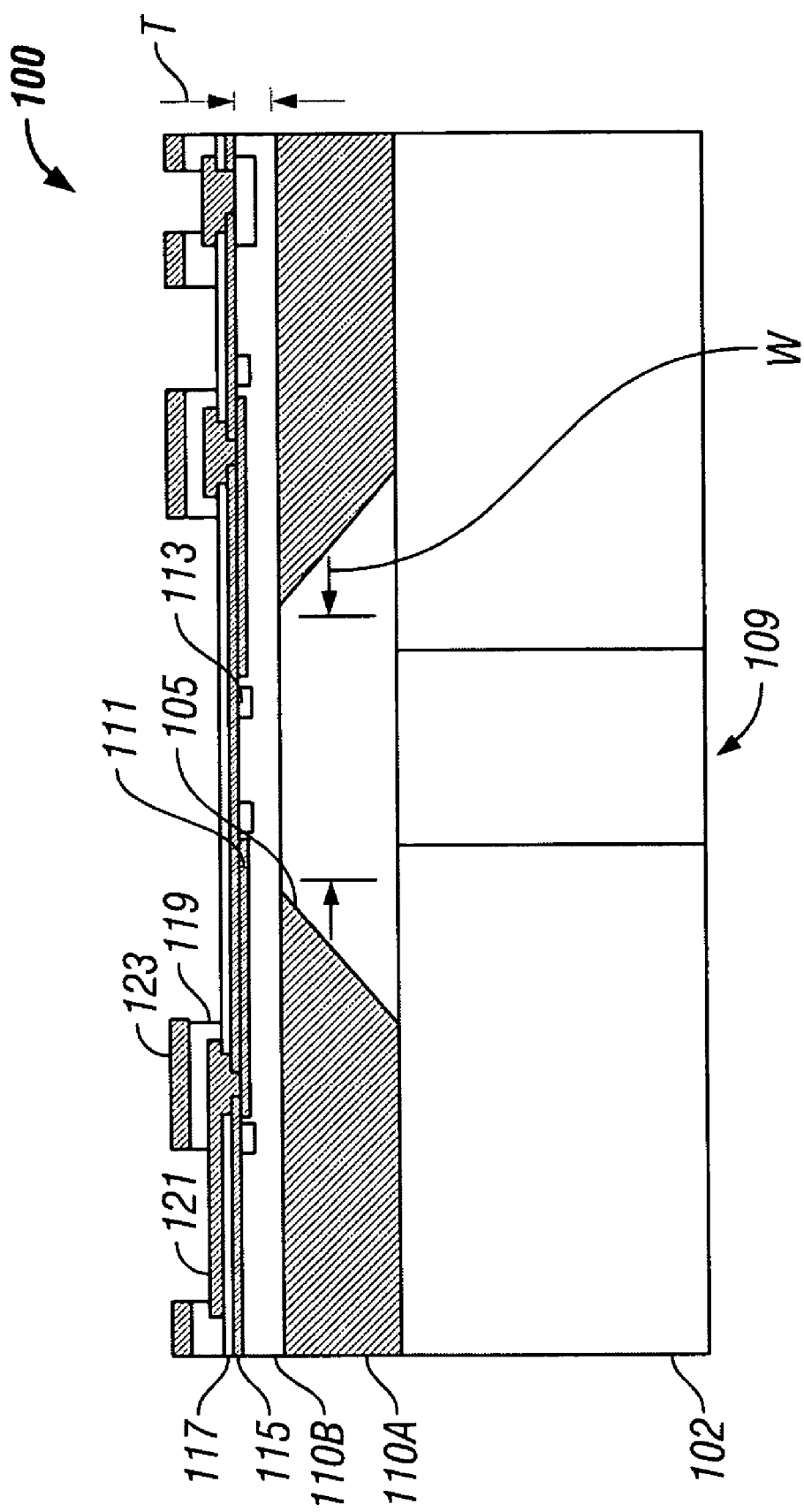
FIG. 1 is a cross sectional view of a relevant portion of an exemplary sensor manufactured using a backside cavity process, according to the prior art.

With reference to FIG. 1, a prior art pressure sensor 100, produced using a backside cavity process, is depicted. As is shown, a handling wafer, e.g., a glass wafer, 102 is bonded to a silicon wafer 110, which includes an N-type epitaxial layer, which forms a membrane 110B having a thickness T, e.g., about 12 microns. Prior to bonding of the wafers 102 and 110, a cavity having a sidewall 105 is formed into a backside of a portion 110A of the wafer 110. In a typical application, the width W of the cavity at the point of the membrane 110B is approximately 1160 microns. As is shown, the sidewall 105 forms an angle of approximately 125.3 degrees, with respect to the membrane 110B. For differential sensing, a hole 109 may be located through a backside of the wafer 102 approximate the cavity.

As is shown, a plurality of N+ diffusions 113 are positioned in the membrane 110B. Implanted into the membrane 110B are a plurality of implants 111, which may be, for example, piezoresistive elements. A nitride layer 117 is formed over an oxide layer 115 and a metal layer, e.g., an aluminum silicon layer, 121 is formed over the nitride layer 117 to provide contacts for the implants 111. Another oxide layer 119 is formed over a portion of the metal layer 121 and a nitride layer 123 is formed over the oxide layer 119. While the sensor 100 provides an angle of about 125.3 degrees at the interface between the sidewall 105 and the membrane 110B, a width W of the membrane 110B is approximately 1160 microns at the cavity. Unfortunately, the cost of the pressure sensor 100 is higher than required, as the sensor 100 consumes more silicon area than electrically required.

Figure 2:
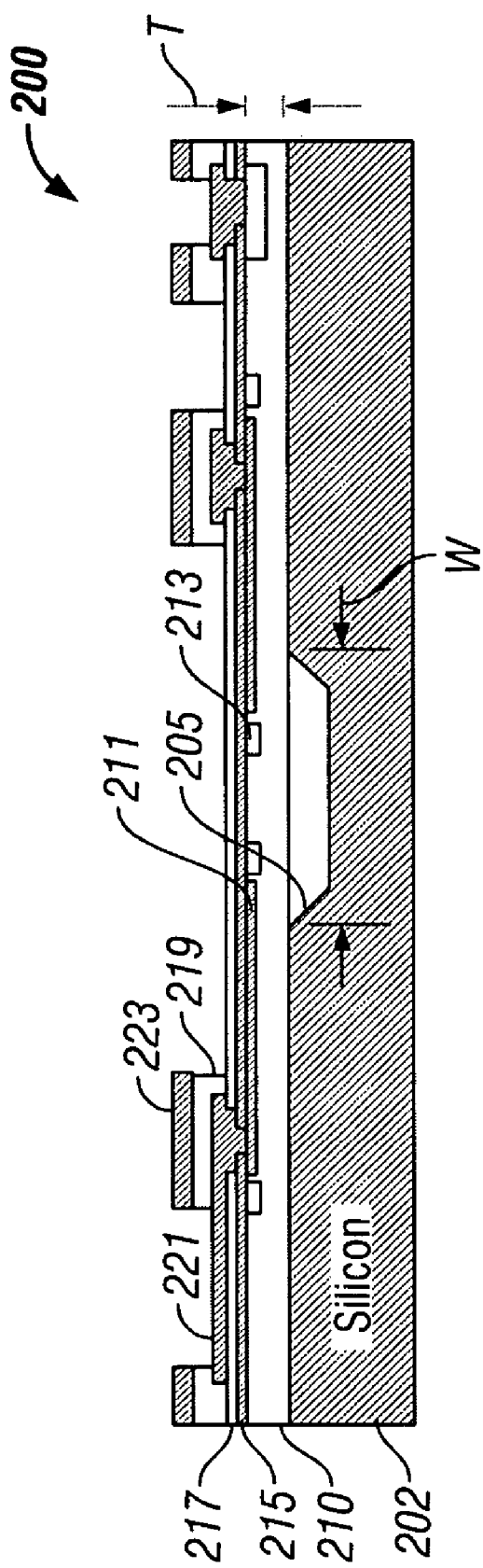
FIG. 2 is a cross sectional view of a relevant portion of an exemplary sensor manufactured using a cavity-on-top process, according to the prior art.

With reference to FIG. 2, a relevant portion of a pressure sensor 200, fabricated using the cavity-on-top process, is further depicted. As is shown in FIG. 2, the sensor 200 includes a first wafer 202, which has a cavity formed therein, and a second wafer 210, which is an N-type epitaxial wafer. The wafer 210 provides a membrane for the sensor 200. The construction of the sensor 200 is similar to that of the sensor 100 of FIG. 1, with the exception that a sidewall 205 of the cavity meets the membrane 210 at an angle of approximately 54.7 degrees. As is shown in FIG. 2, the width W of the cavity is approximately 660 microns, which allows the dimensions of the pressure sensor 200 to be reduced, as compared to the sensor 100. Thus, the sensor 200 utilizes less silicon area and, as such, provides a sensor having a lower cost. However, due to the angle at which the sidewall 205 meets the membrane 210, the membrane of the sensor 200 is less robust than the membrane 110B of the sensor 100.

The circuitry formed in/on the membrane 110B of the sensor 100 may be similar to the circuitry formed in/on the epitaxial layer 210 of the sensor 200. As is shown, an implant 211 is formed in the N-type epitaxial layer 210 along with a plurality of N-type+ layers 213. An oxide layer 215 is formed over the N-type epitaxial layer 210 and a nitride layer 217 is formed over an oxide layer 215. A metal layer 221 is formed over the nitride layer 217 and extends down into contact with an implant layer 211. As is shown, an oxide layer 219 is formed over a portion of the metal layer 221 and a nitride layer 223 is formed over the oxide layer 219. A typical thickness T of the membrane 210 of the sensor 200 is approximately 18.5 microns.

Figure 3:
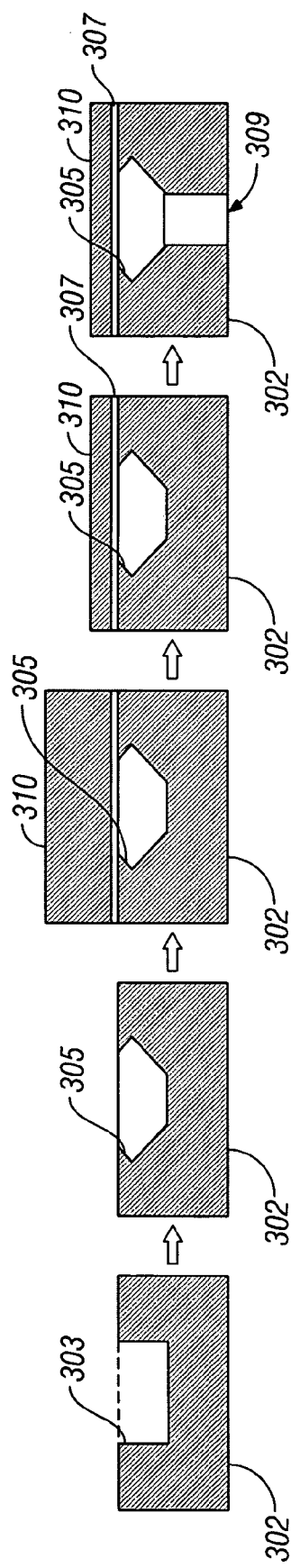
FIG. 3 is a cross sectional view of relevant portions of various components of an exemplary sensor during a manufacturing process according to the present invention.

Turning to FIG. 3, a process sequence for producing a pressure sensor, according to one embodiment of the present invention, is depicted. As is shown, a handling wafer 302 is initially etched using, for example, a deep reactive ion etch (DRIE), which forms a cavity having a sidewall 303 of approximately 90 degrees. Next, another etch, e.g., a tetramethyl ammonium hydroxide (TMAH) etch, is performed that causes sidewall 305 to be undercut forming an angle of approximately 125.3 degrees, with respect to a top surface of the wafer 302. Next, the first wafer 302 is bonded, e.g., using silicon direct bonding or fused bonding, to a second wafer 310. The second wafer 310 is then etched to form a desired membrane thickness, e.g., 18.5 microns, which provides the basic structure for an absolute pressure sensor. It should be appreciated that any desired circuitry is constructed in/on top of the wafer 310. Finally, if a differential pressure sensor is desired, a DRIE etch may be performed from the backside of the wafer 302, approximate the cavity, to form a hole into the cavity for differential pressure sensing.

Figure 4:
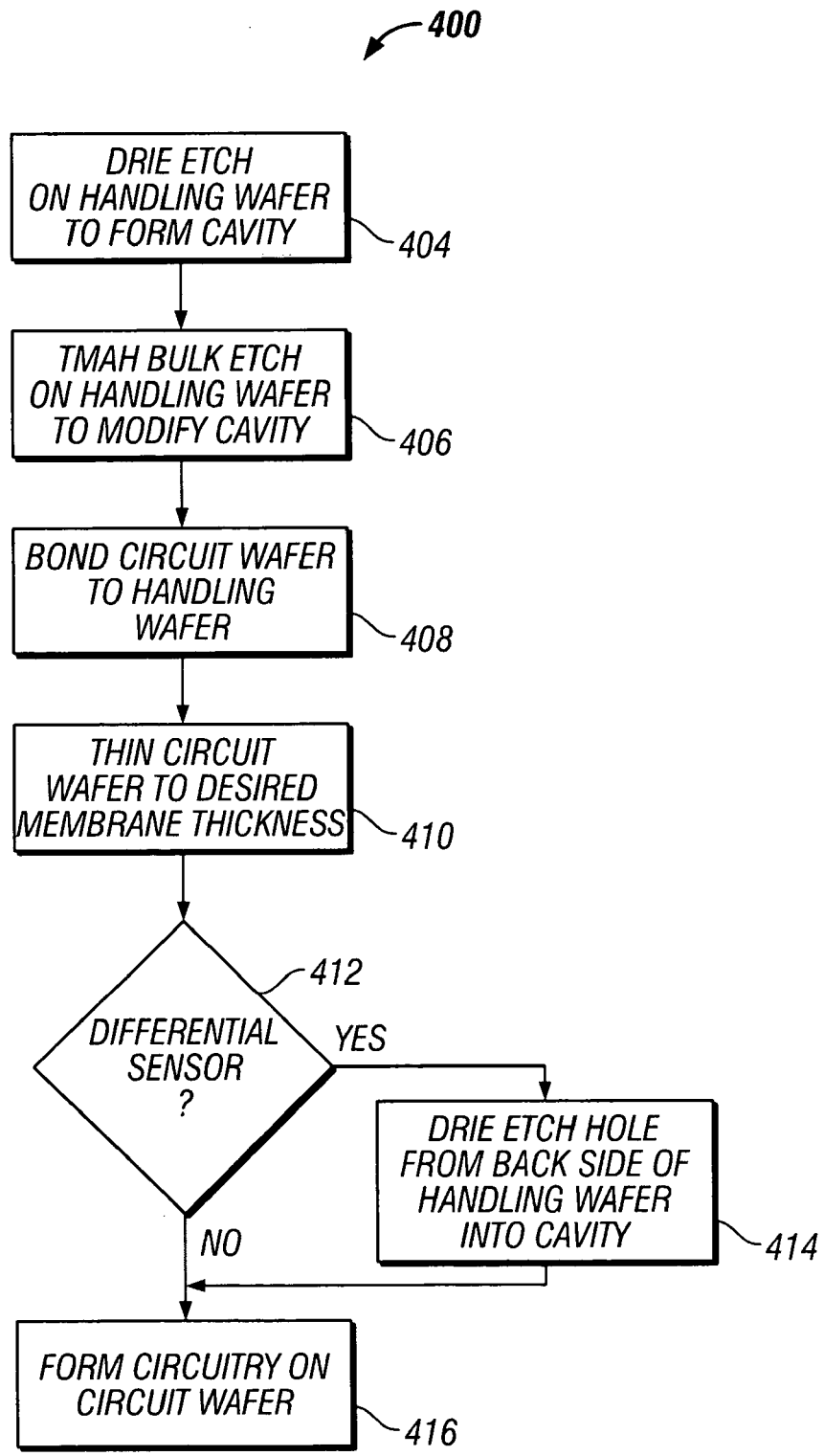
FIG. 4 is a flow diagram of an exemplary process for manufacturing a sensor according to the present invention.
Figure 5:
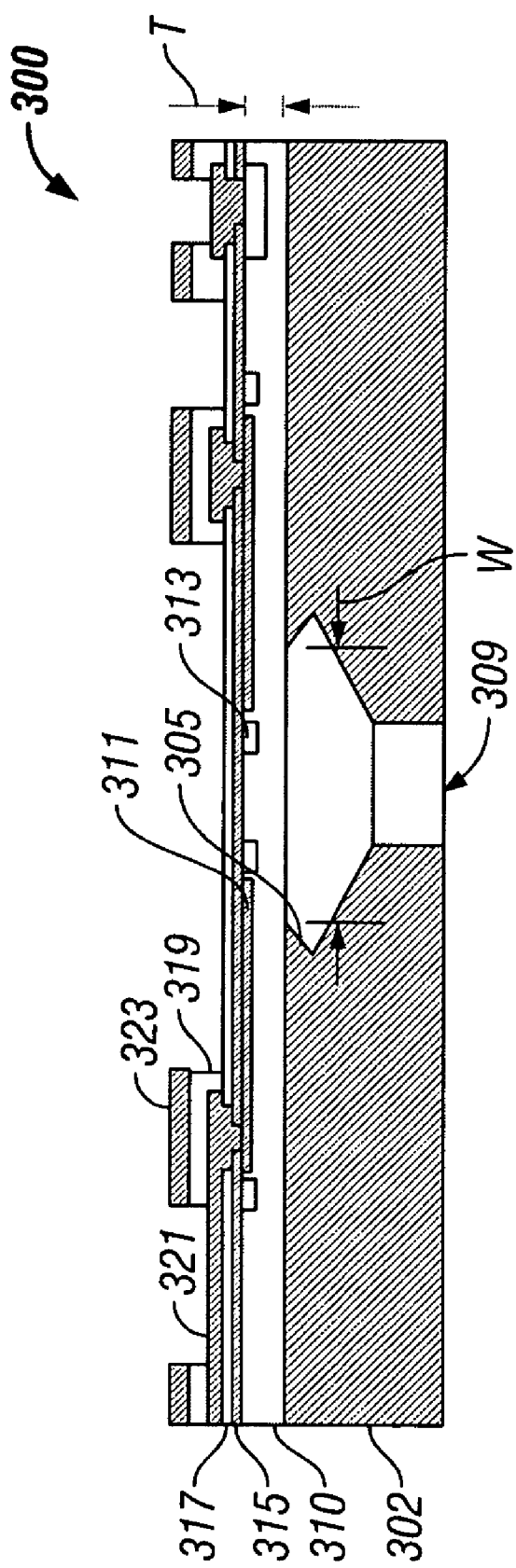
FIG. 5 is a cross sectional view of a relevant portion of an exemplary sensor manufactured according to the present invention.

FIG. 4 depicts a process flow chart for an exemplary process 400 for manufacturing a MEM pressure sensor 300, according to one embodiment of the present invention. With reference to FIGS. 3–5, the process 400 is initiated in step 404, at which point a DRIE etch is performed on the handling wafer 302 to form a cavity having sidewall 303 with an angle of about 90 degrees with respect to an upper surface of the wafer 302. It should be appreciated that an initial angle appreciably less than 90 degrees may be utilized, e.g., an initial angle greater than 54.7 degrees may be used.

Next, in step 406, a TMAH bulk etch step is performed on the handling wafer 302 to modify the sidewall 305 of the cavity to an angle of about 125.3 degrees with respect to the upper surface of the wafer 302. It should be appreciated that a final angle appreciably less than 125.3 degrees may be utilized, e.g., a final angle greater than 90 degrees may be used, providing the sidewall 305 of the wafer 302 has a (111) Miller Indices where it is to meet the wafer 310. Then, in step 408, the handling wafer 302 is bonded to the wafer 310, i.e., the wafer on which circuitry is to be formed. Next, in step 410, the wafer 310 is thinned to a desired membrane thickness.

Then, in decision step 412, when a differential pressure sensor is to be produced, a hole is formed using a DRIE from the backside of the handling wafer 302 into the cavity in step 414. Otherwise, when an absolute pressure sensor is to be produced, circuitry is formed on the circuit wafer 310 in step 416. In step 414, after the hole is etched into the cavity from the backside of the wafer 302, control transfers to step 416, before the process 400 is terminated.

FIG. 5 shows a pressure sensor 300 fabricated according to the process 400 of FIG. 4. As is shown in FIG. 5, the sensor 300 includes a wafer 302 and a wafer 310, which are bonded together. A cavity is formed in the wafer 302 by the process described above in order to provide sidewall 305 having approximately 125.3 degrees, with respect to a top surface of the wafer 302 at the sidewall 305/wafer 310 interface. Desired circuitry is formed on top of the N-type epitaxial layer 310 and may include an oxide layer 315, a nitride layer 317, an implant 311, a plurality of N-type+ diffusions 313, as well as an oxide layer 319, a nitride layer 323 and a metal layer 321. As with the previous sensors described above, the thickness of the membrane is selected to be a desired thickness, e.g., 18.5 microns.

Accordingly, processes have been described herein that advantageously allow the size of a micro-electro mechanical pressure sensor to be reduced, while providing a sensor whose membrane is adequately supported and, thus, is not as prone to damage, as prior art sensors having similar dimensions.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. A method for manufacturing micro-electro mechanical (MEM) structures, comprising the steps of:
    forming a cavity into a first side of a first wafer that functions as a handling wafer, wherein a sidewall of the cavity forms a first angle greater than 54.7 degrees with respect to a plane defined by the first side of the handling wafer, wherein the first angle extends from the plane into the cavity to the sidewall, and wherein the first angle subtends at least a portion of the cavity;
    performing a bulk etch on the first side of the handling wafer to modify the sidewall of the cavity to a second angle greater than about 90 degrees with respect to a plane defined by the first side of the handling wafer, wherein the second angle extends from the plane into the cavity to the sidewall, and wherein the second angle subtends at least a portion of the cavity; and
    bonding a second side of a second wafer to the first side of the handling wafer to cover the cavity such that the cavity is inaccessible, wherein the second side of the second wafer is opposite a first side of the second wafer, wherein the second wafer is an epitaxial wafer, and wherein the epitaxial wafer includes a buried etch stop layer positioned at a desired depth from the first side of the epitaxial wafer.

2. The method of claim 1, wherein the epitaxial wafer is an N-type wafer and the buried etch stop layer is a P-type++ etch stop layer.

3. The method of claim 1, further comprising the steps of:
    removing a portion of the epitaxial wafer from the first side of the epitaxial wafer until the etch stop layer is exposed; and
    removing the etch stop layer from the epitaxial wafer to provide a membrane.

4. The method of claim 3, wherein a thickness of the membrane is between about 10 microns and 25 microns.

5. A method for manufacturing micro-electro mechanical (MEM) structures, comprising the steps of:
    forming a cavity into a first side of a first wafer that functions as a handling wafer, wherein a sidewall of the cavity forms a first angle greater than about 54.7 degrees with respect to a plane defined by the first side of the handling wafer, wherein the first angle extends from the plane into the cavity to the sidewall, and wherein the first angle subtends at least a portion of the cavity;
    performing a bulk etch on the first side of the handling wafer to modify the sidewall of the cavity to a second angle greater than about 90 degrees with respect to a plane defined by the first side of the handling wafer, wherein the second angle extends from the plane into the cavity to the sidewall, and wherein the second angle subtends at least a portion of the cavity;
    bonding a second side of a second wafer to the first side of the handling wafer to cover the cavity such that the cavity is inaccessible, wherein the second side of the second wafer is opposite a first side of the second wafer;
    removing a portion of the second wafer from the first side of the second wafer to provide a membrane; and
    forming desired circuitry on the first side of the second wafer, wherein the first and second wafers are N-type silicon wafers.

6. The method of claim 5, wherein the second wafer includes a buried etch stop layer positioned at a desired depth from the first side of the second wafer.

7. The method of claim 5, wherein the bulk etch is a wet etch.

8. A method for manufacturing micro-electro mechanical (MEM) structures, comprising the steps of:
- forming a cavity into a first side of a first wafer that functions as a handling wafer, wherein a sidewall of the cavity forms a first angle greater than 54.7 degrees with respect to a plane defined by the first side of the handling wafer, wherein the first angle extends from the plane into the cavity to the sidewall, and wherein the first angle subtends at least a portion of the cavity;
- performing a bulk etch on the first side of the handling wafer to modify the sidewall of the cavity to a second angle greater than about 90 degrees with respect to a plane defined by the first side of the handling wafer, wherein the second angle extends from the plane into the cavity to the sidewall, and wherein the second angle subtends at least a portion of the cavity;
- bonding a second side of a second wafer to the first side of the handling wafer to cover the cavity such that the cavity is inaccessible, wherein the second side of the second wafer is opposite a first side of the second wafer; and
- forming a hole through the handling wafer to the inaccessible cavity from a second side of the handling wafer that is opposite the first side of the handling wafer, rendering the cavity accessible.

9. The method of claim 8, wherein the hole is formed using a deep reactive ion etch (DRIE).

10. The method of claim 8, further including the step of forming desired circuitry on the first side of the second wafer prior to forming a hole through the handling wafer from the second side of the handling wafer to the inaccessible cavity.

11. A method for manufacturing micro-electro mechanical (MEM) structures, comprising the steps of:
- forming a cavity into a first side of a first wafer that functions as a handling wafer, wherein a sidewall of the cavity forms a first angle of about 90 degrees with respect to a plane defined by the first side of the handling wafer, wherein the first angle extends from the plane into the cavity to the sidewall, and wherein the first angle subtends at least a portion of the cavity;
- performing a bulk etch on the first side of the handling wafer to modify the sidewall of the cavity to a second angle of about 125.3 degrees with respect to a plane defined by the first side of the handling wafer, wherein the second angle extends from the plane into the cavity to the sidewall, and wherein the second angle subtends at least a portion of the cavity;
- bonding a second side of a second wafer to the first side of the handling wafer to cover the cavity such that the cavity is inaccessible, where in the second side of the second wafer is opposite a first side of the second wafer;
- removing a portion of the second wafer from the first side of the second wafer to provide a membrane, wherein a thickness of the membrane is between about 10 microns and 25 microns; and
- forming desired circuitry on the first side of the second wafer.

12. The method of claim 11, wherein the second wafer is an epitaxial wafer, and wherein the epitaxial wafer includes a buried etch stop layer positioned at a desired depth from the first side of the epitaxial wafer.

13. The method of claim 12, further comprising the steps of:
- removing a portion of the epitaxial wafer from the first side of the epitaxial wafer until the etch stop layer is exposed; and
- removing the etch stop layer from the epitaxial wafer to provide the membrane.

14. The method of claim 12, wherein the epitaxial wafer is an N-type wafer and the buried etch stop layer is a P-type++ etch stop layer.

15. The method of claim 11, wherein the first and second wafers are silicon wafers.

16. The method of claim 11, wherein the first and second wafers are N-type silicon wafers having (100) Miller Indices.

17. The method of claim 11, further comprising the step of:
- forming a hole through the handling wafer to the inaccessible cavity from a second side of the handling wafer that is opposite the first side of the handling wafer, rendering the cavity accessible.

18. The method of claim 17, wherein the hole is formed using a deep reactive ion etch (DRIE).

19. The method of claim 11, wherein said bulk etch is a wet etch.

* * * * *